United States Patent [19]
Opina

[11] Patent Number: 4,802,945
[45] Date of Patent: Feb. 7, 1989

[54] VIA FILLING OF GREEN CERAMIC TAPE

[75] Inventor: Patricia B. Opina, Riverside, Calif.

[73] Assignee: Hughes Aircraft Company, Los Angeles, Calif.

[21] Appl. No.: 173,001

[22] Filed: Mar. 23, 1988

Related U.S. Application Data

[63] Continuation of Ser. No. 917,323, Oct. 9, 1986, abandoned.

[51] Int. Cl.$^4$ .............................................. B32B 31/18
[52] U.S. Cl. ................................. 156/247; 156/89; 156/249; 156/252; 156/253; 427/97
[58] Field of Search ............... 156/89, 247, 249, 252, 156/253; 427/97

[56] References Cited

U.S. PATENT DOCUMENTS

| | | | |
|---|---|---|---|
| 3,948,706 | 4/1976 | Schmeckenbecher | 427/97 |
| 3,956,052 | 5/1976 | Koste et al. | 156/247 |
| 4,226,659 | 10/1980 | Griffith et al. | 156/253 |
| 4,645,552 | 2/1987 | Vitriol et al. | 156/89 |

FOREIGN PATENT DOCUMENTS

| | | | |
|---|---|---|---|
| 0040905 | 12/1981 | | . |
| 70591 | 4/1984 | Japan | 156/89 |
| 8603337 | 6/1986 | | . |

OTHER PUBLICATIONS

Desai et al., "Method of Controlling a Paste-Filled Via Diameter in a Ceramic Green Sheet", (IBM Tech. Bull.), vol. 22, No. 5, 10/1979.

Primary Examiner—Caleb Weston
Attorney, Agent, or Firm—Kenneth W. Float; A. W. Karambelas

[57] ABSTRACT

A process is disclosed for filling vias in a sheet of dielectric tape for use in fabricating hybrid multilayer circuit structures. The process includes the steps of securing a sheet of dielectric tape (11) comprising a dielectric layer and a supporting carrier layer to a frame (13), forming vias (19) in the dielectric tape, securing the frame with the dielectric tape to a via filling fixture (17), filling the vias with via fill metallization, and removing the dielectric tape from the via filling fixture. The process further contemplates filling vias of dielectric tape secured directly to an exposed surface of a hybrid circuit during the manufacturing process.

13 Claims, 3 Drawing Sheets

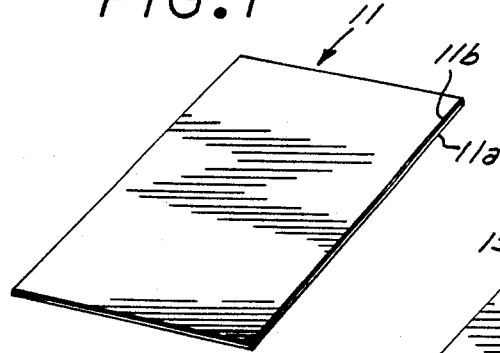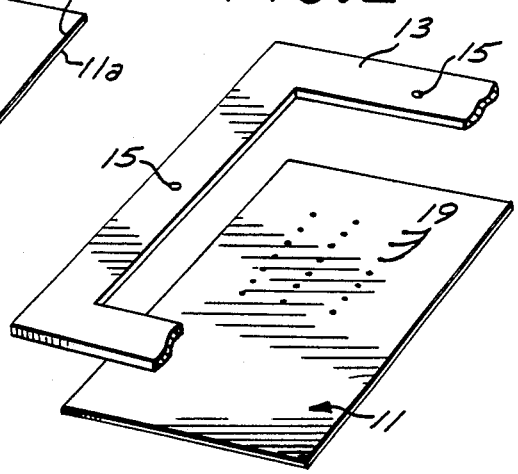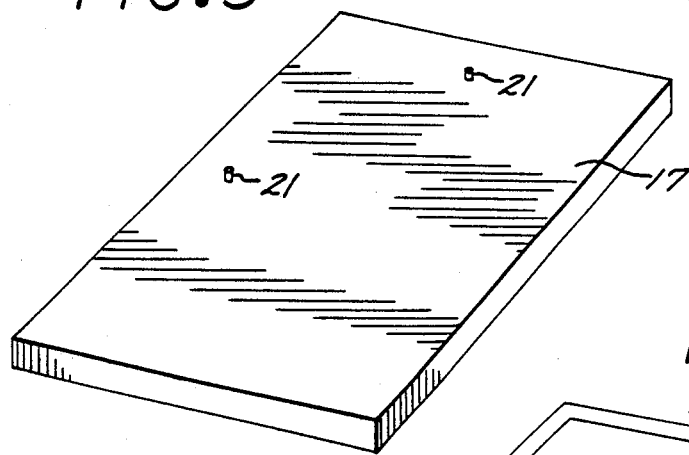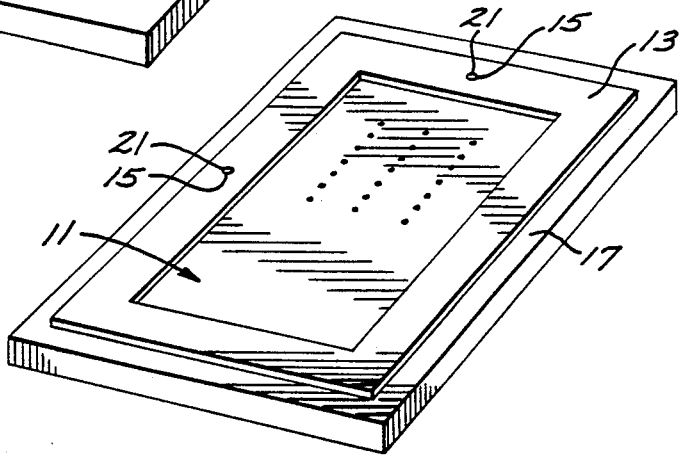

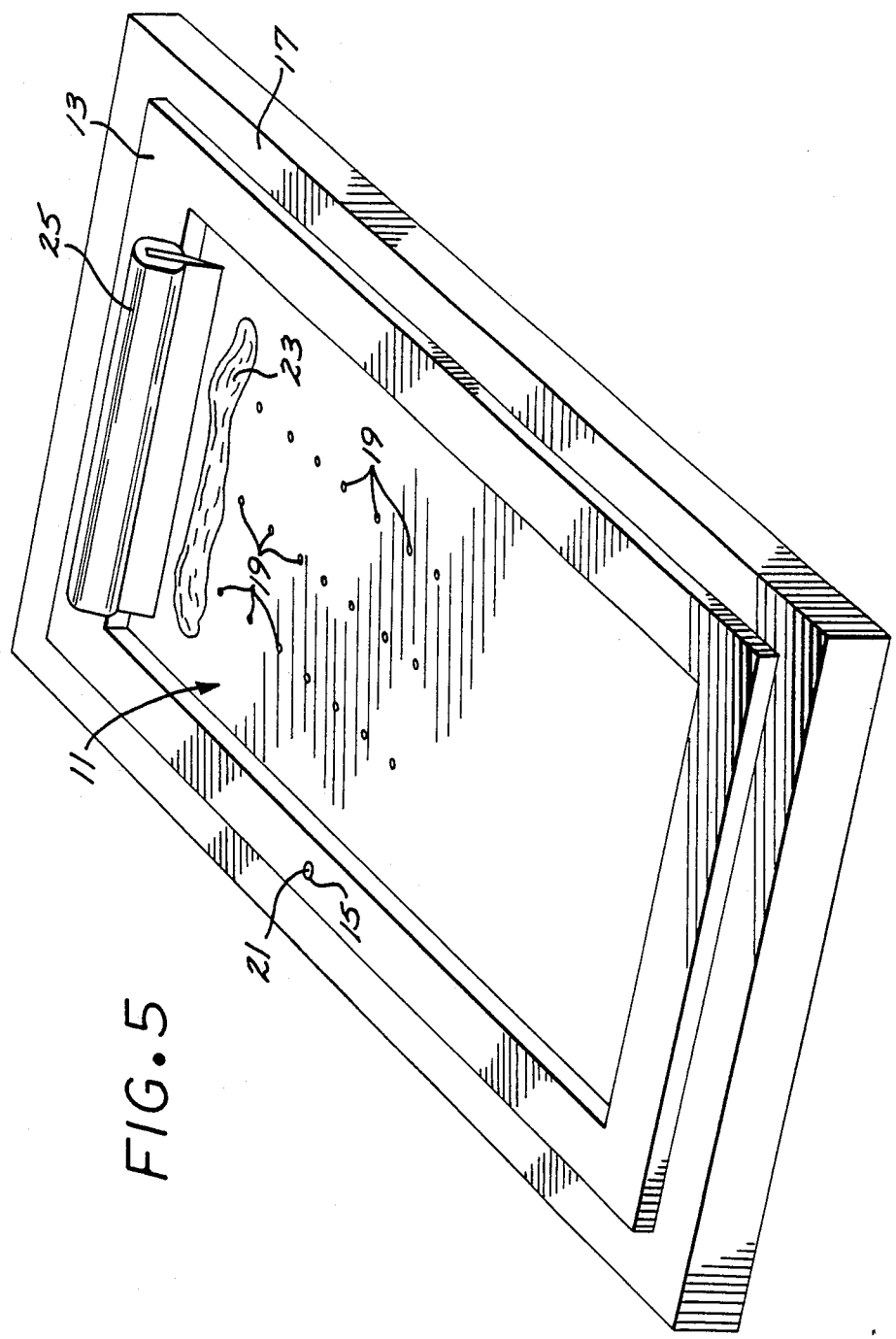

VIA FILLING OF GREEN CERAMIC TAPE

CROSS-REFERENCE TO RELATED APPLICATION

This application is a continuation of application Ser. No. 06/917,323, filed Oct. 9, 1986, abandoned.

BACKGROUND OF THE INVENTION

The disclosed invention generally relates to the metallization of pyrolyzable dielectric tapes utilized in the fabrication of multilayer hybrid circuits and structures, and more particularly is directed to a process for filling vias in such pyrolyzable dielectric tapes with metallization without the use of a screen printer.

Hybrid multilayer circuit structures may be made with layered sheets of dielectric tape known in the art as "green tape." Generally, each layer of green tape is individually screen printed to fill preformed vias with metallizaiton and to provide areas of metallization on its surface.

In one known process, referred to as a cofired ceramic process, each layer of green tape is individually punched to form via holes, and then screen printed to provide conductor patterns and to fill via holes with metallization. The individual layers of screen printed green tape are then stacked in the required order, and laminated together using a chosen temperature and pressure. The laminated structure is then fired at a desired elevated temperature.

In another process, identified as the tape transfer process, disclosed in U.S. Pat. No. 4,645,552, issued Feb. 24, 1987, and assigned to the assignee of the present application, a layer of green tape having preformed vias is positioned on and registered to an insulating substrate having, for example, a conductive pattern thereon. The positioned green tape is laminated to the insulating substrate in a laminating press. The laminated structure is then heated to a predetermined elevated temperature sufficient to drive off the organic binder material in the green tape and to securely fuse the inorganic filler material in the green tape to the underlying substrate and the conductive pattern. The conductive pattern and the metallization in the via holes of the laminated green tape are then provided by screen printing.

In both of the foregoing processes, the vias in a layer of green tape are filled with metallization by screen printing. An important consideration with filling vias by screen printing is the importance of precise registration of the print screen with the vias. Changes in relative positions will result in misregistration of the via fill print screen. A further consideration with screen printing via fill is the inability to use very small vias, which precludes denser packing of components. Screen printing via fill may also result in unfilled vias due to a clogged screen.

SUMMARY OF THE INVENTION

It would therefore be an advantage to provide a process of filling vias in dielectric tape which does not utilize screen printing.

Another advantage would be to provide a process for filling vias in dielectric tape which allows for very small vias.

Still another advantage would be to provide a process for filling vias in dielectric tape which provides a uniform via fill.

The foregoing and other advantages and features are provide in a process which includes the steps of (a) forming via holes in a sheet of dielectric tape having a dielectric layer and a supporting carrier layer, (b) securing the dielectric tape with the dielectric side of the dielectric tape securely fixed relative to and in contact with a support surface to prevent lateral motion of the dielectric tape relative to the support surface, and (c) filling the via holes with via fill paste. The support surface may be the top surface of a via filling fixture, in which case the dielectric tape with filled via holes would be removed for use, further processing, or storage. Also, the support surface may be the top surface of an insulating substrate or another layer of a hybrid circuit.

BRIEF DESCRIPTION OF THE DRAWING

The advantages and features of the disclosed invention will readily be appreciated by persons skilled in the art from the following detailed description when read in conjunction with the drawing wherein:

FIG. 1 is a schematic illustration of dielectric tape which may be utilized with the process of the invention.

FIG. 2 schematically illustrates a frame for securing the dielectric tape in accordance with the invention.

FIG. 3 schematically illustrates a via filling fixture which may be utilized with the invention.

FIG. 4 schematically illustrates the use of the via filling fixture of FIG. 3 with the frame of FIG. 2.

FIG. 5 schematically depicts the filling of vias in the dielectric tape secured to the via filling fixture of FIG. 3 with the frame of FIG. 2.

DETAILED DESCRIPTION

Figure 6:
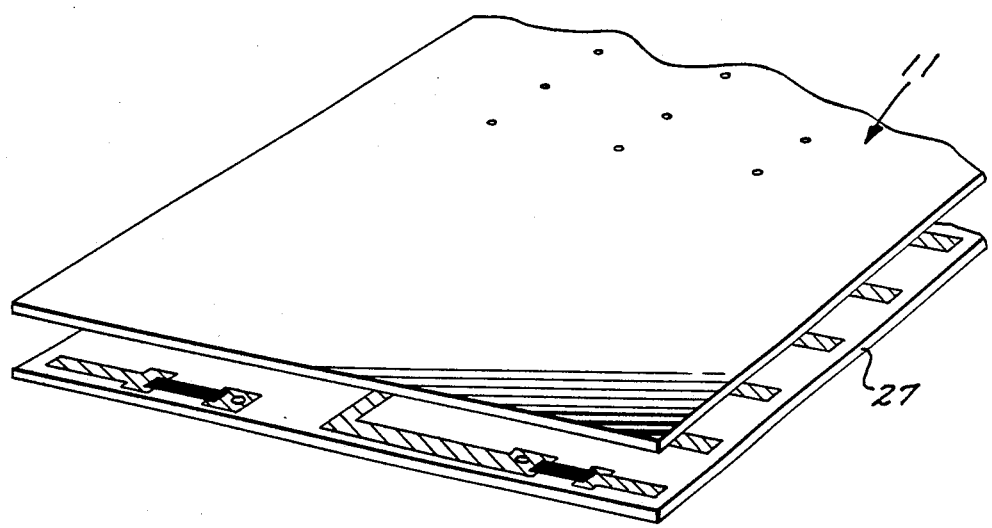
FIG. 6 and 7 schematically illustrate the use of the invention with dielectric tape that is laminated to an exposed surface of a substrate of a hybrid circuit or a previously fired layer of a hybrid circuit.

In the following detailed description and in the several figures of the drawing, like elements are identified with like reference numerals.

Referring now to FIG. 1, a sheet of pyrolyzable pliable dielectric tape 11 is provided. The sheet of dielectric tape 11 includes a dielectric layer 11a and an organic carrier layer 11b. Generally, the dielectric layer 11a is an alumina (aluminum oxide) filled glass with an organic binder, and is also referred to as a glass-ceramic. Other metal oxides such as beryllium oxide may also be used. The organic carrier layer 11b may be a sheet of Mylar brand film.

Dielectric tape for making the sheet of dielectric tape 11 may be may be obtained from E.I. DuPont de Nemours and Company of Wilmington, Delaware, under the generic references of "green tape" or "ceramic tape." The "green" terminology does not refer to the color, but to the fact that it is an unfired ceramic tape.

The perimeter of the carrier side of the sheet of dielectric tape 11 is glued (e.g., with a water soluble glue) or otherwise secured to the bottom of a flat frame 13. By way of example, the sheet of dielectric tape 11 is shown as being rectangular, and the frame 13 has a rectangular opening. The side of the frame 13 secured to the sheet of dielectric tape 11 is substantially coplanar so that the sheet of dielectric tape 11 is secured in substantially one plane. By way of example, the frame 13 may be made of machined aluminum.

The frame 13 further includes two registration holes 15 which are utilized with a via filling fixture 17 described below. After the sheet of dielectric tape 11 is secured to the frame 13, vias 19 are formed pursuant to the via pattern appropriate for the sheet of dielectric tape 11 being processed. For example, the vias 19 may be formed by mechanical punching, air or laser drilling, hydrostatic pressure, or photolithographic techniques. Alternatively, the vias 19 may be formed prior to securing the sheet of dielectric tape 11 to the frame 13.

The via filling fixture 17 is basically a rigid panel which has a planar top surface and may be made of machined aluminum. The fixture 17 includes on its top surface two registration pins 21 which correspond to the two registration holes 15 in the frame 13.

The frame 13 with the sheet of dielectric tape 11 secured thereto is placed on the via filling fixture 17 with the holes 15 securely engaged wtih the pins 21. The bottom surface of the sheet of dielectric tape 11 is in intimate contact with the top surface of the via filling fixture, and the engaged holes 15 and pins 21 prevent lateral movement of the sheet of dielectric tape 11 relative to the via filling fixture 17. Alternatively, a releaseable organic film such as a sheet of Mylar film may be interposed between the sheet of dielectric tape 11 and the top surface of the via filling fixture 17.

After the sheet of dielectric tape 11 is secured on the via filling fixture 17, via fill paste 23 is placed on the top surface (the carrier side) of the sheet of dielectric tape 11 and is forced into the vias 19 with a squeegee 25. The squeegee 25 is illustrated schematically and may be implemented as a machine actuated device or a manually actuated device. After the vias 19 are filled with via fill paste, the excess paste is removed from the top surface of the sheet of dielectric tape, for example, with the squeegee 25. The sheet of dielectric tape 11, including the organic carrier layer 11b, is peeled off the frame 13 and the glued perimeter portions are trimmed off. The via-filled and trimmed sheet of dielectric tape 11 may then be stored or utilized as appropriate.

Figure 7:

The invention further contemplates securing a dielectric tape having vias formed therein to the exposed surface of an insulating substrate of a hybrid circuit or to the exposed surface of a previously fired layer of a hybrid circuit. As shown in FIGS. 6 and 7, the dielectric tape 11, with its organic carrier layer on top, is laminated to a substrate or previously fired layer 27 in a laminating press at an appropriate temperature with an appropriate pressure. After lamination, a squeegee is utilized to fill the via holes with via fill paste. After via filling, the organic carrier layer is removed for further processing, such as screen printing of conductor runs and passive circuit components, and firing.

The foregoing disclosed invention provides the advantages including the following. The via holes in a sheet of dielectric tape are filled without the use of screen printing, thereby avoiding the necessity of preparing via filling screens. Since via filling screens are not utilized, screen preparation is eliminated and the problems associated with screen printing via fill such as registration and clogging are avoided.

Further, since the organic carrier layer of the sheet of dielectric tape is in intimate contact with the dielectric layer during the formation of the via holes and during the via hole filling procedure, the organic carrier layer functions as a self-registered screen. Since the via holes are accurately filled without the use of screen printing, smaller vias are possible, which in turn facilitate greater packing density.

The foregoing disclosed invention is readily incorporated in known processes that utilize dielectric tape, including but not limited to the cofired ceramic process and the tape transfer process discussed previously in the Background of the Invention section hereof.

Although the foregoing has been a description and illustration of specific embodiments of the invention, various modifications and changes thereto can be made by persons skilled in the art without departing from the scope and spirit of the invention as defined by the following claims.

What is claimed is:

1. A method of filling via holes disposed in a sheet of unfired pyrolyzable dielectric material with conductive material, said method comprising the steps of:
   providing a sheet of unfired pyrolyzable dielectric material having a backing material secured to one surface thereof, the sheet of dielectric material and the backing material having a predetermined pattern of via holes disposed therein;
   securing the sheet of dielectric material and its backing material to a support structure with the backing material exposed;
   depositing conductive material into the via holes of the sheet of dielectric material using the backing material as a mask layer; and
   separating the backing material from the sheet of dielectric material to provide a sheet of unfired dielectric material having conductive material disposed in the via holes thereof.

2. The method of claim 1 wherein the step of securing the sheet of dielectric material includes the step of securing the periphery of the backing material to a frame and securing the frame including the sheet of dielectric material against a flat surface, with the dielectric side of the sheet against the flat surface.

3. The method of claim 1 wherein the step of securing the sheet of dielectric material includes the step of laminating the sheet of dielectric material to an exposed surface of a hybrid circuit.

4. The method of claim 1 wherein the step of securing the sheet of dielectric material includes the step of laminating the dielectric material to a previously fired layer of a hybrid circuit.

5. A method of filling via holes disposed in a sheet of dielectric material with conductive material, said method comprising the steps of:
   providing a sheet of dielectric material comprising a dielectric layer and a supporting carrier layer secured to one surface thereof:
   forming via holes in the sheet of dielectric material;
   securing the sheet of dielectric material to a support surface by disposing the dielectric layer in contact with and securely fixed relative to the support surface to prevent lateral motion of the sheet of dielectric material;
   disposing conductive material in the via holes of the dielectric material using the supporting carrier layer as a mask; and
   separating the supporting carrier layer from the dielectric layer in order to provide a sheet of dielectric material having via holes filled with conductive material.

6. The method of claim 5 wherein the step of securing the sheet of dielectric material includes the step of securing the periphery of the supporting carrier layer to a frame and securing the frame including the sheet of dielectric material against a flat surface, with the dielectric side of the sheet against the flat surface.

7. The method of claim 5 wherein the step of securing the sheet of dielectric material includes the step of laminating the sheet of dielectric material to an exposed surface of a hybrid circuit.

8. The method of claim 5 wherein the step of securing the sheet of dielectric material includes the step of laminating the dielectric material to a previously fired layer of a hybrid circuit.

9. A method of filling via holes disposed in a sheet of dielectric material with conductive material, said method comprising the steps of:
   forming via holes in a sheet of dielectric material having a dielectric layer and a supporting carrier layer;
   securing the sheet of dielectric material such that the dielectric side of the sheet of dielectric material is securely fixed relative to and in contact with a support surface to prevent lateral motion of the sheet of dielectric material relative to the support surface, said securing step including securing the periphery of the supporting carrier side of the sheet of dielectric material to a frame and securing the frame including the sheet of dielectric material against a flat surface, with the dielectric side of the sheet against the flat surface; and
   filling the via holes with conductive material using the supporting carrier layer as a mask.

10. A method of filling via holes disposed in a sheet of dielectric material with conductive material, said method comprising the steps of:
    forming via holes in a sheet of dielectric material comprising a dielectric layer and a supporting carrier layer;
    securing the sheet of dielectric material by securing the periphery of the supporting carrier side of the sheet of dielectric material to a support surface such that the sheet of dielectric material is fixed relative to and in contact with the support surface to prevent lateral motion thereof relative to the support surface; and
    filling the via holes with conductive material using the supporting carrier layer as a mask.

11. A method of filling via holes disposed in a sheet of green dielectric material with conductive material, said method comprising the steps of:
    providing a sheet of green dielectric material having a removable backing material disposed in contact with one surface thereof and having via holes disposed through the green dielectric material and backing material;
    securing the sheet of green dielectric material and the backing material to a support surface by disposing the other surface of said dielectric material in contact with and securely fixed relative to the support surface to prevent lateral motion of the sheet of dielectric material;
    disposing conductive material in the via holes of the dielectric material and backing material to fill the via holes using the backing material as a mask; and
    peeling the backing material from the green dielectric material to provide a sheet of green dielectric material having via holes filled with conductive material.

12. A method of producing a sheet of green ceramic material having via holes filled with conductive material, said method comprising the steps of:
    providing a sheet of green ceramic material having via holes disposed therein, said sheet comprising a sheet of dielectric material and a sheet of removable backing material;
    securing the sheet of green ceramic material to a support surface such that the exposed surface of the dielectric material is in contact with the support surface;
    depositing conductive material onto the exposed surface of the backing material;
    filling the via holes in the sheet of green ceramic material with the conductive material;
    removing excess conductive material from the surface of the backing material;
    removing the sheet of green ceramic material from the supporting surface; and
    separating the removable backing material from the sheet of dielectric material to provide a sheet of green ceramic material having iva holes filled with conductive material.

13. A method of filling via holes disposed in a sheet of unfired pyrolyzable dielectric material with conductive material, said method comprising the steps of:
    providing a sheet of unfired pyrolyzable dielectric material having a removable backing material secured to one surface thereof;
    securing said sheet of dielectric material and backing material to a support structure such that the sheet of dielectric material is secured in substantially one plane;
    forming a predeteremined pattern of via holes through said sheet of dielectric material and backing material;
    disposing the sheet of dielectric material and backing material while secured in the support structure onto a via filling fixture such that the other surface of the dielectric material is in contact with the surface of the via filling fixture;
    depositing conductive material into the via holes of the sheet of dielectric material using the backing material as a mask;
    removing the sheet of dielectric material having via holes filled with conductive material; and
    separating the backing material from the sheet of dielectric material.

* * * * *